(12) United States Patent
Oka et al.

(10) Patent No.: US 12,002,853 B2
(45) Date of Patent: Jun. 4, 2024

(54) SEMICONDUCTOR DEVICE

(71) Applicant: TOYODA GOSEI CO., LTD., Kiyosu (JP)

(72) Inventors: Toru Oka, Kiyosu (JP); Tsutomu Ina, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 324 days.

(21) Appl. No.: 17/244,604

(22) Filed: Apr. 29, 2021

(65) Prior Publication Data

US 2021/0376082 A1  Dec. 2, 2021

(30) Foreign Application Priority Data

May 29, 2020 (JP) .................................. 2020-095131

(51) Int. Cl.
*H01L 29/08* (2006.01)
*H01L 29/20* (2006.01)
(Continued)

(52) U.S. Cl.
CPC ...... *H01L 29/0843* (2013.01); *H01L 29/2003* (2013.01); *H01L 29/24* (2013.01); *H01L 29/4236* (2013.01)

(58) Field of Classification Search
CPC . H01L 29/0843; H01L 29/2003; H01L 29/24; H01L 29/4236
See application file for complete search history.

(56) References Cited

U.S. PATENT DOCUMENTS 8,969,920 B2   3/2015 Kiyama et al.
9,793,357 B2 * 10/2017 Kono ................. H01L 29/45
(Continued)

FOREIGN PATENT DOCUMENTS

JP   2009-117820 A   5/2009
JP   2011-082397 A   4/2011
(Continued)

OTHER PUBLICATIONS

Japanese Office Action, dated Apr. 25, 2023, in related Japanese Application No. 2020-095131 and English Machine Translation thereof.
(Continued)

*Primary Examiner* — Walter H Swanson
*Assistant Examiner* — Jacob T Nelson
(74) *Attorney, Agent, or Firm* — MCGINN I.P. LAW GROUP, PLLC

(57) ABSTRACT

The present invention provides a semiconductor device in which the contact resistance of the body electrode is reduced without reducing the channel mobility. The p-type layer is a Mg-doped p-GaN layer deposited on the first re-type layer. The p-type layer has a two-layer structure in which a first p-type layer and a second p-type layer are sequentially deposited. The second p-type layer has a Mg concentration higher than the Mg concentration of the first p-type layer. The recess is formed in a predetermined position on the surface of the second n-type layer, and has a depth passing through the second n-type layer and reaching the second p-type layer. The body electrode is formed on the bottom surface of the recess in contact with the p-type layer exposed thereon.

10 Claims, 3 Drawing Sheets

(51) Int. Cl.
*H01L 29/24* (2006.01)
*H01L 29/423* (2006.01)
*H01L 29/78* (2006.01)

(56) References Cited

U.S. PATENT DOCUMENTS

| | | | |
|---|---|---|---|
| 10,593,750 | B2 | 3/2020 | Takeuchi et al. |
| 11,563,092 | B2 | 1/2023 | Higashiwaki et al. |
| 2012/0181548 | A1 | 7/2012 | Okada et al. |
| 2013/0168739 | A1* | 7/2013 | Kiyama ............... H01L 29/778 |
| | | | 257/194 |
| 2016/0104794 | A1 | 4/2016 | Takeuchi et al. |
| 2017/0077238 | A1 | 3/2017 | Kono et al. |
| 2018/0026131 | A1* | 1/2018 | Kurosaki ......... H01L 29/42384 |
| | | | 257/59 |
| 2018/0197983 | A1* | 7/2018 | Kinoshita ............... H01L 29/06 |
| 2019/0035882 | A1 | 1/2019 | Takeuchi et al. |
| 2020/0144377 | A1 | 5/2020 | Higashiwaki et al. |
| 2020/0279955 | A1 | 9/2020 | Takahashi et al. |

FOREIGN PATENT DOCUMENTS

| | | | |
|---|---|---|---|
| JP | 2012-084739 | A | 4/2012 |
| JP | 2012069933 | A * | 4/2012 |
| JP | 2014-236189 | A | 12/2014 |
| JP | 2015-222787 | A | 12/2015 |
| JP | 2017-059600 | A | 3/2017 |
| JP | 2017-152490 | A | 8/2017 |
| JP | 2018-186246 | A | 11/2018 |
| WO | WO2019-098295 | A1 | 5/2019 |

OTHER PUBLICATIONS

Japanese Office Action, dated Apr. 25, 2023, in related Japanese Application No. 2020-095132 and English Machine Translation thereof.

Japanese Office Action, dated Apr. 25, 2023, in related Japanese Application No. 2020-095133 and English Machine Translation thereof.

Ji et al. "Large-Area In-Situ Oxide, GaN Interlayer-Based Vertical Trench MOSFET (OG-FET)" IEEE Electron Device Letters 39 (2018) pp. 711-714.

Masahiro Kodama et al., Applied Physics Express vol. 1, No. 2 (2008) 021104, 1-3, "GaN-Based Trench Gate Metal Oxide Semiconductor Field-Effect Transistor Fabricated with Novel Wet Etching".

* cited by examiner

SEMICONDUCTOR DEVICE

BACKGROUND OF THE INVENTION

Field of the Invention

The present invention relates to a semiconductor device composed of Group III nitride semiconductor or gallium oxide-based semiconductor.

Background Art

A field effect transistor (FET) is known to have a body electrode being connected to a body layer. For GaN, the method for producing a p-type region by ion implantation has not been established, and a p-type region is difficult to be formed. Therefore, in a GaN based FET, a p-type region is generally formed in an epitaxially growing layer structure. Then, a recess passing through an n-GaN layer on a p-GaN body layer and reaching the body layer is formed by dry etching, and a body electrode is formed in contact with a bottom surface of the recess (refer to Japanese Patent Application Laid-Open (kokai) No. 2009-117820). For $Ga_2O_3$ as well, a p-type region is difficult to be formed by ion implantation. In a $Ga_2O_3$ based FET, a p-type region needs to have the same structure as in the GaN based FET.

When a recess is formed by dry etching, etching damage is caused on the surface of the body layer exposed by etching. Etching damage reduces the acceptor concentration of the surface of the body layer, thereby increasing the contact resistance between the body layer and the body electrode. When a high voltage is applied to an interface, i.e., a pn junction, between a channel and a drift layer in off operation, holes generated in a vicinity of the interface are not sufficiently extracted from the body electrode due to high contact resistance. As a result, avalanche breakdown voltage is reduced.

Even if the acceptor concentration of the body layer is reduced due to etching damage, sufficient acceptors can be obtained by increasing the acceptor concentration. However, when the acceptor concentration of the body layer is increased, channel mobility is reduced, and channel resistance is increased. That is, on-resistance is increased.

SUMMARY OF THE INVENTION

In view of the foregoing, an object of the present invention is to reduce the contact resistance of the body electrode while suppressing the increase of on-resistance.

In an aspect of the present invention, there is provided a semiconductor device as a transistor, having a semiconductor layer comprising Group III nitride semiconductor or gallium oxide-based semiconductor in which a first n-type layer, a p-type layer, and a second n-type layer are sequentially deposited, a recess reaching the p-type layer from the surface of the second n-type layer, and a body electrode in contact with the p-type layer exposed on a bottom surface of the recess, wherein the p-type layer has a first p-type layer, and a second p-type layer deposited on the first p-type layer and having an acceptor concentration higher than the acceptor concentration of the first p-type layer, the recess has a depth reaching the second p-type layer, and a bottom surface of the body electrode is in contact with the second p-type layer exposed on the bottom surface of the recess.

In the aspect of the invention, the second p-type layer may preferably have a thickness of 0.05 μm to 0.2 μm. Moreover, the second p-type layer may preferably have an acceptor concentration of $1\times10^{19}/cm^3$ to $1\times10^{20}/cm^3$.

The depth of the recess may be preferably set so that the second p-type layer has a thickness of not less than 0.05 μm in a region under the recess.

The first p-type layer may preferably have an acceptor concentration of not more than $6\times10^{18}/cm^3$.

The p-type layer may further have a third p-type layer disposed in contact with the first n-type layer, and the third p-type layer may have an acceptor concentration higher than the acceptor concentration of the first p-type layer and not more than the acceptor concentration of the second p-type layer. The third p-type layer may preferably have a thickness of 0.1 μm to 0.2 μm.

The second p-type layer may be the top layer of the p-type.

The distance between a bottom surface of the second re-type layer and the bottom surface of the body electrode may preferably be not less than 0 μm and not larger than 0.15 μm.

The first p-type layer may preferably have a thickness of 0.5 μm to 1.5 μm.

The present invention is suitable for a vertical semiconductor device having a trench gate structure.

In the present invention, the p-type layer comprises a first p-type layer and a second p-type layer, the acceptor concentration of the second p-type layer is higher than the acceptor concentration of the first p-type layer. Therefore, the contact resistance of the body electrode can be reduced while suppressing the increase of on-resistance.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

First Embodiment

Figure 1:
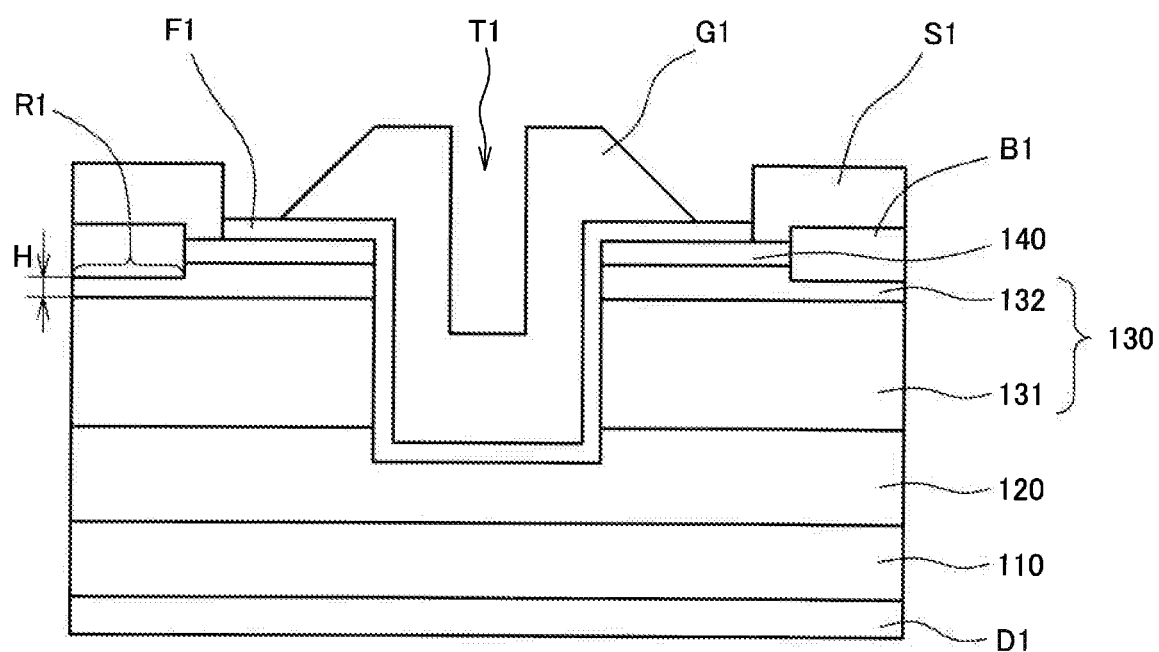
FIG. 1 shows the structure of a semiconductor device according to a first embodiment.

FIG. 1 shows the structure of a semiconductor device according to a first embodiment. As shown in FIG. 1, the semiconductor device according to the first embodiment is a vertical MISFET having a trench gate structure, which includes a substrate 110, a first n-type layer 120, a p-type layer 130, a second n-type layer 140, a trench T1, a recess R1, a gate insulating film F1, a gate electrode G1, a source electrode S1, a body electrode B1, and a drain electrode D1.

The substrate 110 is a flat plate-shaped substrate comprising Si-doped n-GaN having a c-plane main surface. The substrate 110 has a thickness of, for example, 300 μm and a Si concentration of, for example, $1×10^{18}/cm^3$. Any conductive material other than n-GaN may be used as a substrate for growing Group III nitride semiconductor. For example, ZnO or Si may be used. However, in terms of lattice matching, a GaN substrate is preferably used as in the present embodiment. Si is used as an n-type impurity in the first embodiment. However, any element other than Si, for example, Ge or O may be used.

The first n-type layer 120 is a Si-doped n-GaN layer deposited on the substrate 110. The first n-type layer 120 has a thickness of, for example, 10 μm, and a Si concentration of, for example, $8×10^{15}/cm^3$.

The p-type layer 130 is a p-GaN layer deposited on the first n-type layer 120 and doped with Mg as a p-type impurity (acceptor). The p-type layer 130 has a two-layer structure in which a first p-type layer 131 and a second p-type layer 132 are sequentially deposited. In the first embodiment, Mg is used as a p-type impurity. However, any element other than Mg, for example, Be or Zn may be used.

The first p-type layer 131 has a Mg concentration lower than the Mg concentration of the second p-type layer 132. The first p-type layer 131 has a thickness of, for example, 0.55 μm, and a Mg concentration of, for example, $2×10^{18}/cm_3$. The first p-type layer may have a thickness of 0.5 μm to 1.5 μm. By reducing the Mg concentration of the first p-type layer 131 not in contact with the body electrode B1 of a plurality of layers constituting the p-type layer 130, the reduction of channel mobility can be suppressed, and the increase of on-resistance can be suppressed. Because the channel is mainly formed in the first p-type layer 131 which is thicker than the second p-type layer 132, the channel mobility is kept to be higher and the on-resistance is kept to be lower.

The first p-type layer 131 preferably has a Mg concentration of not more than $6×10^{18}/cm^3$. This can suppress the reduction of channel mobility and reduce the on-resistance.

The second p-type layer 132 has a Mg concentration higher than the Mg concentration of the first p-type layer 131. The second p-type layer 132 is provided to reduce the contact resistance between the p-type layer 130 and the body electrode B1. The second p-type layer 132 has a thickness of, for example, 0.15 μm, and a Mg concentration of, for example, $1×10^{19}/cm^3$.

The details of the reason why the p-type layer 130 has a two-layer structure of the first p-type layer 131 and the second p-type layer 132 are as follows.

The contact resistance of the body electrode B1 is reduced by increasing the Mg concentration of the second p-type layer 132 in contact with the body electrode B1 of two layers of the p-type layer 130. When the contact resistance is reduced, holes generated in the p-type layer 130 can be efficiently extracted, and avalanche breakdown voltage can be increased.

The Mg concentration is increased only in the second p-type layer 132 in contact with the body electrode B1 of the p-type layers 130. The Mg concentration of the first p-type layer 131 not in contact with the body electrode B1 is set lower than the Mg concentration of the second p-type layer 132. Therefore, the reduction of channel mobility can be suppressed, and the increase of on-resistance can be suppressed.

In the MISFET having a trench gate structure, since a trench T1 is formed by dry etching, etching damage is caused on the surface of the p-type layer 130 exposed on the side surface of the trench T1, and a threshold voltage, i.e., gate turn-on voltage, becomes lower than the designed value. However, the threshold voltage can be increased by forming a second p-type layer 132 with a high Mg concentration.

The second p-type layer 132 preferably has a Mg concentration of $1×10^{19}/cm^3$ to $1×10^{20}/cm^3$. By setting the Mg concentration of the second p-type layer 132 to not less than $1×10^{19}/cm^3$, a sufficient acceptor concentration can be obtained even if etching damage is caused on the second p-type layer 132 due to the formation of a recess R1. Moreover, by setting the Mg concentration of the second p-type layer 132 to not more than $1×10^{20}/cm^3$, deterioration in crystal quality or reduction in electron concentration of the second n-type layer 140 being formed on the second p-type layer 132 can be suppressed.

The second p-type layer 132 preferably has a thickness of 0.05 μm to 0.2 μm. By setting the thickness of the second p-type layer 132 to not less than 0.05 μm, a sufficient acceptor concentration can be obtained even if etching damage is caused on the second p-type layer 132 due to the formation of a recess R1. Moreover, by setting the thickness of the second p-type layer 132 to not more than 0.2 μm, deterioration in crystal quality or reduction in electron concentration of the second n-type layer 140 being formed on the second p-type layer 132 can be suppressed.

The second n-type layer 140 is a Si-doped n-GaN layer deposited on the p-type layer 130. The second n-type layer 140 has a thickness of, for example, 0.2 μm and a Si concentration of, for example, $3×10^{18}/cm^3$.

The trench T1 is formed in a predetermined position on the surface of the second n-type layer 140, and has a depth passing through the second n-type layer 140 and the p-type layer 130 and reaching the first n-type layer 120. The first n-type layer 120 is exposed on the bottom surface of the trench T1. The first n-type layer 120, the p-type layer 130, and the second n-type layer 140 are exposed on the side surface of the trench T1. The side surface of the p-type layer 130 exposed on the side surface of the trench T1 is a region serving as an FET channel of the first embodiment.

The gate insulating film F1 is formed in a film continuously from the bottom surface, the side surface of the trench T1 to the surface of the second n-type layer 140 (except for the region where the source electrode S1 was formed). The gate insulating film F1 is made of $SiO_2$. The gate insulating film F1 has a thickness of, for example, 80 nm.

The gate insulating film F1 is not necessarily made of $SiO_2$, and may be made of $Al_2O_3$, $HfO_2$, $ZrO_2$, ZrON, and others. The gate insulating film F1 is not necessarily a single layer, and may include a plurality of layers, for example, $SiO_2/Al_2O_3$, and $SiO_2/Al_2O_3/ZrON$. Here, the symbol "/" means depositing, and A/B means a layered structure in which a layer of A is first formed and a layer of B is then formed. The symbol "/" will be used in the same meaning in the description of materials provided below.

The gate electrode G1 is formed in a film continuously from the bottom surface, the side surface to the top surface of the trench T1 on the gate insulating film F1. The gate electrode G1 is made of TiN.

The recess R1 is formed in a predetermined position on the surface of the second n-type layer 140, and has a depth passing through the second n-type layer 140 and reaching the second p-type layer 132, but not reaching the first p-type layer 131. The second p-type layer 132 is exposed on the bottom surface of the recess R1. The second p-type layer 132 and the second n-type layer 140 are exposed on the side surface of the recess R1. Since the recess R1 is formed by dry etching, etching damage is caused on the bottom surface of recess R1.

The recess R1 may have any depth as long as the second p-type layer 132 is exposed and the first p-type layer 131 is not exposed on the bottom surface of the recess R1. However, the depth of the recess R1 is preferably set so that the thickness H from the bottom surface of the recess R1 to the interface between the second p-type layer 132 and the first p-type layer 131 (i.e., the thickness of the second p-type layer 132 in a region where the second p-type layer 132 is exposed by the recess R1) is not less than 0.05 μm. Also, the distance from the bottom surface of the recess R1 to the interface between the second p-type layer 132 and the second n-type layer 140, may preferably be not less than 0 μm and not larger than 0.15 μm. By setting the depth of the recess R1 to such a depth, the contact resistance between the body electrode B1 and the p-type layer 130 can be sufficiently reduced.

The body electrode B1 is formed on the bottom surface of the recess R1 in contact with the second p-type layer 132 exposed thereon. The body electrode B1 is made of Ni. Also, the body electrode B1 may be made of at least one of Ni, Ni/Pd, other metal alloy, deposited metals, and other material having ohmic contact to p-type semiconductor. Since etching damage exists on the bottom surface of the recess R1, the acceptor concentration of the bottom surface of the recess R1 is reduced. However, the Mg concentration of the second p-type layer 132 subject to etching damage is higher than the Mg concentration of the first p-type layer 131, thereby reducing the contact resistance between the body electrode B1 and the p-type layer 130, i.e., the contact resistance to the second p-type layer 132.

The source electrode S1 is continuously formed on the body electrode B1 and the second n-type layer 140. The source electrode S1 is made of Ti/Al.

The drain electrode D1 is formed on a back side of the substrate 110. The drain electrode D1 is made of Ti/Al which is the same material as that of the source electrode S1.

In the semiconductor device according to the first embodiment, the p-type layer 130 has a two-layer structure of the first p-type layer 131 and the second p-type layer 132, and the Mg concentration of the second p-type layer 132 in contact with the body electrode B1 is higher than the Mg concentration of the first p-type layer 131. Therefore, the contact resistance between the p-type layer 130 and the body electrode B1 can be reduced. The Mg concentration of the first p-type layer 131 not in contact with the body electrode B1 of the p-type layer 130 is lower than the Mg concentration of the second p-type layer 132. Therefore, the reduction of channel mobility can be suppressed, and the increase of on-resistance can be suppressed. In this way, with the structure of the p-type layer 130 of the first embodiment, the contact resistance of the body electrode B1 can be reduced while suppressing the increase of on-resistance.

Next will be described processes for producing the semiconductor device according to the first embodiment with reference to FIGS. 2A to 2D.

Figure 2A:
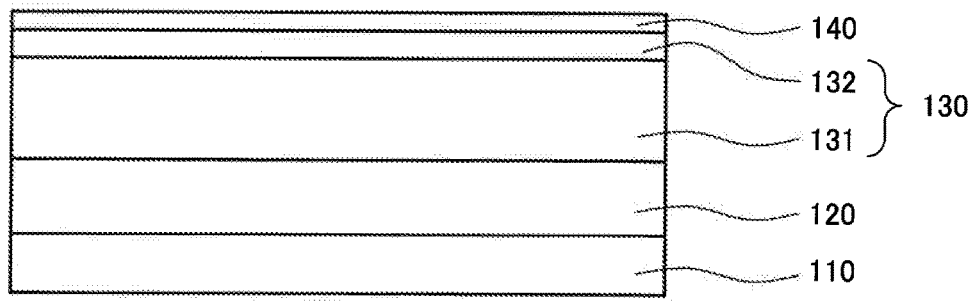
FIGS. 2A to 2D are sketches showing processes for producing the semiconductor device according to the first embodiment.

Firstly, a first n-type layer 120, a first p-type layer 131, a second p-type layer 132, and a second n-type layer 140 are sequentially deposited through MOCVD on a substrate 110 (refer to FIG. 2A). In MOCVD, ammonia is used as a nitrogen source, trimethylgallium (Ga(CH$_3$)$_3$:TMG) is used as a Ga source, silane (SiH$_4$) is used as an n-type dopant gas, and biscyclopentadienylmagnesium (Mg(C$_5$H$_5$)$_2$:CP$_2$Mg) is used as a p-type dopant gas. Hydrogen is used as a carrier gas. Any crystal growth method other than MOCVD, for example, MBE or CBE may also be employed.

Figure 2B:
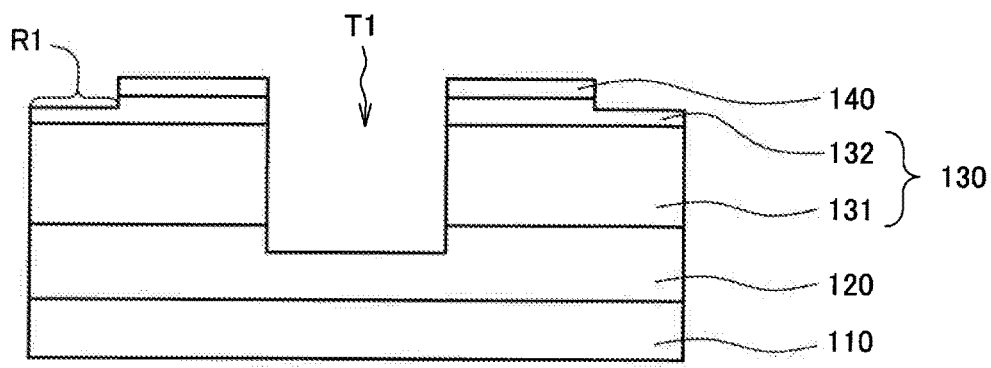

Subsequently, a trench T1 and a recess R1 are formed by dry etching predetermined positions on the surface of the second n-type layer 140 (refer to FIG. 2B). After the trench T1 was formed, the recess R1 may be formed. Or after the recess R1 was formed, the trench T1 may be formed. Chlorine-based gas such as Cl$_2$, SiCl$_4$, and BCl$_3$ is used for dry etching. Any method such as ICP etching may be used for dry etching. Through dry etching, etching damage is caused on the side surface and the bottom surface of the trench T1 and the recess R1. For GaN, the method for producing a p-type region by ion implantation has not been established. To form a body electrode B1 in contact with the p-type layer 130, the recess R1 needs to be formed to expose the p-type layer 130.

After the formation of the trench T1 and the recess R1, the layer damaged by dry etching may be removed by wet etching the side surface. Wet etching solution such as TMAH (Tetramethylammonium hydroxide), NaOH (sodium hydroxide), KOH (potassium hydroxide), and H$_3$PO$_4$ (phosphoric acid) may be used. Since the bottom surface of the trench T1 and the recess R1 is a c-plane of GaN, they are hardly etched, and the damaged layer is not sufficiently removed. As a result, etching damage remains.

Next, the p-type layer 130 attains p-type conduction by heating in a nitrogen atmosphere. Hydrogen efficiently escapes from the p-type layer 130 exposed on the bottom surface of the recess R1 or the side surface of the trench T1, thereby efficiently activating Mg in the p-type layer 130.

Figure 2C:
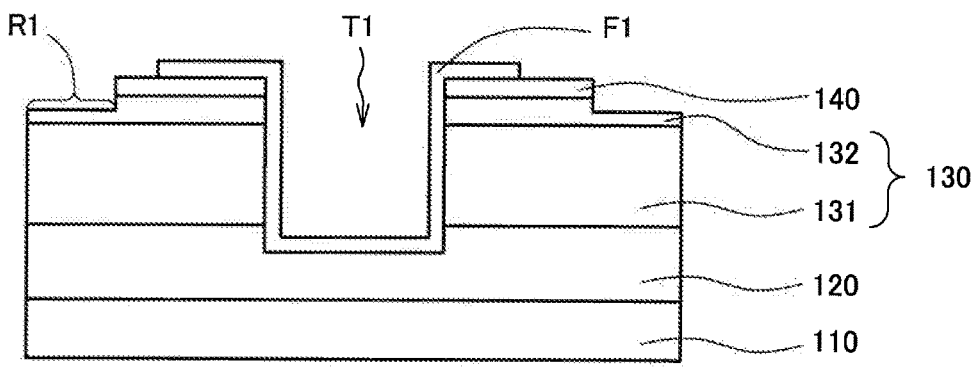

A SiO$_2$ gate insulating film F1 is formed by ALD continuously on the bottom surface and the side surface of the trench T1, and the surface of the second n-type layer 140 (refer to FIG. 2C). By using ALD, the gate insulating film F1 has a uniform thickness even if there is a step due to the trench T1. In the first embodiment, the gate insulating film F1 is formed by ALD because of its high step coverage. However, the gate insulating film F1 may be formed by sputtering or CVD.

Figure 2D:
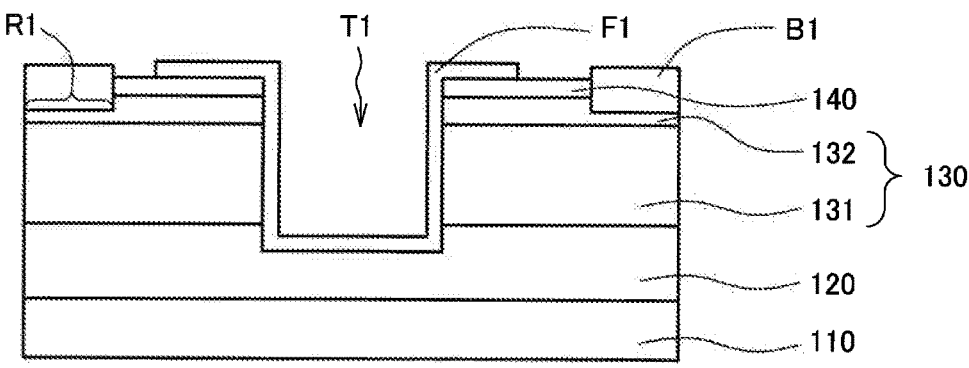

A body electrode B1 is formed by lift-off method on the bottom surface of the recess R1 (refer to FIG. 2D). Since the recess R1 is formed by dry etching, etching damage is caused on the bottom surface of the recess R1. Etching damage reduces the acceptor concentration of the bottom surface of the recess R1. However, the Mg concentration of the second p-type layer 132 subject to etching damage is higher than the Mg concentration of the first p-type layer 131, thereby compensating the reduction of the acceptor concentration and reducing the contact resistance between the body electrode B1 and the p-type layer 130, i.e., the second p-type layer 132. Accordingly, holes are effectively extracted to the body electrode B1 and avalanche breakdown voltage can be increased.

A source electrode S1 and a gate electrode G1 are formed by lift-off method, and further a drain electrode D1 is formed on an entire back side of the substrate 110. In this way, the semiconductor device according to the first embodiment shown in FIG. 1 is produced.

Second Embodiment

Figure 3:
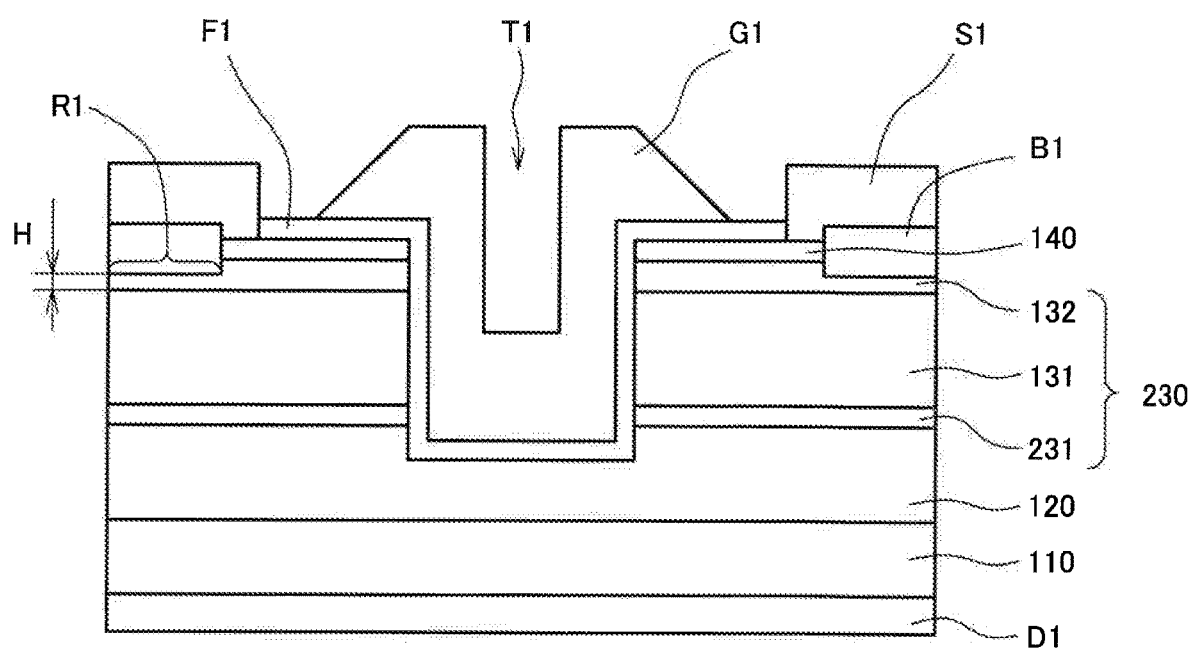
FIG. 3 shows the structure of a semiconductor device according to a second embodiment.

FIG. 3 shows the structure of a semiconductor device according to a second embodiment. The semiconductor device according to the second embodiment has a structure in which a third p-type layer 231 is further formed between the first n-type layer 120 and the first p-type layer 131 in the semiconductor device according to the first embodiment. That is, the p-type layer 130 is substituted by a p-type layer 230 having a three-layer structure in which a third p-type layer 231, a first p-type layer 131, and a second p-type layer 132 are sequentially deposited. Other structure is the same as that of the semiconductor device according to the first embodiment.

The third p-type layer 231 has a Mg concentration higher than the Mg concentration of the first p-type layer 131 and not more than the Mg concentration of the second p-type layer 132. By making the Mg concentration of the third p-type layer 231 higher than the Mg concentration of the first p-type layer 131, the expansion of the depletion layer to the p-type layer 230 can be minimized, and the deterioration of the gate insulating film F1 can be suppressed. By making the Mg concentration of the third p-type layer 231 not more than the Mg concentration of the second p-type layer 132, the increase of channel resistance and the increase of on-resistance can be suppressed. The third p-type layer 231 has a thickness of, for example, 0.1 μm, and a Mg concentration of, for example, $6 \times 10^{18}/cm^3$.

The third p-type layer 231 preferably has a thickness of 0.1 μm to 0.2 μm. As long as the thickness is within this range, both the deterioration of the gate insulating film F1 and the increase of on-resistance can be efficiently suppressed.

Variations

In the first embodiment, the p-type layer has a two-layer structure. In the second embodiment, the p-type layer has a three-layer structure. In the present invention, the p-type layer may have any number of layers as long as the p-type layer has two or more layers. In the first and second embodiments, the second p-type layer 132 having the highest Mg concentration of a plurality of layers constituting the p-type layer is the top layer. However, it may not be the top layer. However, the second p-type layer 132 is preferably the top layer in terms of easiness of forming the recess R1.

The semiconductor device according to the first and second embodiments, is an FET having a vertical trench gate structure. However, an FET having a body electrode is applicable to a semiconductor device having any structure, for example, a horizontal FET or a planar FET.

The first and second embodiments are a GaN semiconductor device. However, the present invention is not limited to a GaN semiconductor device, but is applicable to a Group III nitride semiconductor device. The present invention is also applicable to a gallium oxide-based semiconductor device. A gallium oxide-based semiconductor is an oxide semiconductor of gallium oxide ($Ga_2O_3$) or gallium oxide with Ga site partially substituted by Al or In. For Group III oxide semiconductor or gallium oxide-based semiconductor, a p-type region is difficult to be formed by ion implantation. Therefore, the p-type layer needs to be exposed by the recess R1. Thus, the present invention is preferable.

In the first and second embodiments, the p-type region formed by ion implantation does not in an active region, i.e., channel, but the p-type region formed by ion implantation may exist in the terminal end region of the channel.

The embodiments were described using a field effect transistor (FET). However, the present invention can also be implemented in a transistor having a trench type insulating gate structure such as IGBT. Also, the NOSFET may be normally on type, i.e., depression mode type. In the first and second embodiments, FET is a trench gate vertical MOSFET, however, FET may be a vertical MOSFET not including a trench for the gate electrode.

The semiconductor device of the present invention can be employed as a power device.

What is claimed is:

1. A semiconductor device as a transistor, having a semiconductor layer comprising Group III nitride semiconductor or gallium oxide-based semiconductor, the semiconductor device comprising:
   a trench with an inner surface which is covered with a gate insulating film, the trench having a gate electrode therein;
   a first n-type layer, a p-type layer, and a second n-type layer which are sequentially deposited;
   a recess reaching the p-type layer from the surface of the second n-type layer; and
   a body electrode in contact with the p-type layer exposed on a bottom surface of the recess,
   wherein
   the p-type layer comprises:
   a third p-type layer disposed in contact with the first n-type layer;
   a first p-type layer disposed in contact with the third p-type layer, the first p-type layer having an acceptor concentration lower than an acceptor concentration of the third p-type layer; and
   a second p-type layer deposited on the first p-type layer, the second p-type layer having an acceptor concentration higher than the acceptor concentration of the first p-type layer and not lower than the acceptor concentration of the third p-type layer, and
   the recess has a depth reaching the second p-type layer, side surfaces of the third p-type layer, the first p-type layer, and the second p-type layer are in contact with a side surface of the gate insulating film, respectively, all of the side surfaces being a region serving as a channel of the transistor, and
   a bottom surface of the body electrode is in contact with the second p-type layer exposed on the bottom surface of the recess.

2. The semiconductor device according to claim 1, wherein the second p-type layer has a thickness of 0.05 μm to 0.2 μm.

3. The semiconductor device according to claim 1, wherein the second p-type layer has an acceptor concentration of $1 \times 10^{19}/cm^3$ to $1 \times 10^{20}/cm^3$.

4. The semiconductor device according to claim 1, wherein the depth of the recess is set so that the second p-type layer has a thickness of not less than 0.05 μm in a region under the recess.

5. The semiconductor device according to claim 1, wherein the first p-type layer has an acceptor concentration of not more than $6 \times 10^{18}/cm^3$.

6. The semiconductor device according to claim 1, wherein the third p-type layer has a thickness of 0.1 μm to 0.2 μm.

7. The semiconductor device according to claim 1, wherein the second p-type layer is the top layer of the p-type layer.

8. The semiconductor device according to claim 1, wherein the semiconductor device is a vertical semiconductor device having a trench gate structure.

9. The semiconductor device according to claim 1, wherein a distance between a bottom surface of the second n-type layer and the bottom surface of the body electrode is not less than 0 μm and not larger than 0.15 μm.

10. The semiconductor device according to claim 1, wherein the first p-type layer has a thickness of 0.5 μm to 1.5 μm.

* * * * *